United States Patent
Chen

(10) Patent No.: US 10,993,217 B2
(45) Date of Patent: Apr. 27, 2021

(54) COMMUNICATION METHOD AND DEVICE

(71) Applicant: Alcatel Lucent, Nozay (FR)

(72) Inventor: Yu Chen, Shanghai (CN)

(73) Assignee: Alcatel Lucent, Nozay (FR)

( * ) Notice: Subject to any disclaimer, the term of this patent is extended or adjusted under 35 U.S.C. 154(b) by 0 days.

(21) Appl. No.: 16/483,954

(22) PCT Filed: Feb. 2, 2018

(86) PCT No.: PCT/IB2018/000183
§ 371 (c)(1),
(2) Date: Aug. 6, 2019

(87) PCT Pub. No.: WO2018/142226
PCT Pub. Date: Aug. 9, 2018

(65) Prior Publication Data
US 2020/0092857 A1  Mar. 19, 2020

(30) Foreign Application Priority Data
Feb. 6, 2017 (CN) .......................... 201710067177.7

(51) Int. Cl.
*H04W 72/04* (2009.01)
*H04L 1/00* (2006.01)
(Continued)

(52) U.S. Cl.
CPC ......... *H04W 72/042* (2013.01); *H04L 1/0076* (2013.01); *H04W 52/0212* (2013.01); *H04W 72/048* (2013.01)

(58) Field of Classification Search
None
See application file for complete search history.

(56) References Cited

U.S. PATENT DOCUMENTS 8,774,101 B2 * 7/2014 Lim ...................... H04L 5/0094
370/329
2005/0128999 A1  6/2005 Kwon et al.
(Continued)

FOREIGN PATENT DOCUMENTS

CN         1890901 A    1/2007
CN       101043257 A    9/2007
(Continued)

OTHER PUBLICATIONS

AT&T, "Design of Polar Codes for Control Channel in NR," $3^{rd}$ Generation Partnership Project, 3GPP TSG RAN WG1 NR Ad-Hoc Meeting, R1-1700324, pp. 1-3, XP051207861, Spokane, USA, Jan. 16-20, 2017.
(Continued)

*Primary Examiner* — Hong S Cho
(74) *Attorney, Agent, or Firm* — Fay Sharpe LLP

(57) ABSTRACT

Embodiments of the present disclosure relate to a communication method and a communication device. There is provided a communication method implemented at a first device. The method comprises: determining quantities of information of units in control information; mapping, based on the quantities of information of the units and reliabilities of subchannels for carrying the control information, the units to a subchannels; and transmitting the control information to a second device via the subchannel. There is also provided a communication method implemented at a second device, as well as corresponding first device and second device.

16 Claims, 7 Drawing Sheets

(51) Int. Cl.
*H04L 5/00* (2006.01)
*H04W 52/02* (2009.01)

(56) References Cited

U.S. PATENT DOCUMENTS

| | | |
|---|---|---|
| 2010/0027704 A1 | 2/2010 | Ho et al. |
| 2012/0128095 A1 | 5/2012 | Kwon et al. |
| 2017/0324514 A1 | 11/2017 | Shen et al. |
| 2018/0183464 A1* | 6/2018 | Ge .................. H04L 1/0041 |
| 2020/0187166 A1* | 6/2020 | Xu .................. H04L 1/0057 |

FOREIGN PATENT DOCUMENTS

| | | |
|---|---|---|
| CN | 103532690 A | 1/2014 |
| EP | 1 798 926 A1 | 12/2006 |
| WO | WO 2016/119105 A1 | 8/2016 |

OTHER PUBLICATIONS

Huawei et al., "Polar Code Construction for NR," $3^{rd}$ Generation Partnership Project, 3GPP TSG RAN WG1 Meeting #86bis, R1-1608862, 8 pages, XP051148916, Lisbon, Portugal, Oct. 10-14, 2016.

International Search Report for PCT/162018/000183 dated May 17, 2018.

Chinese Search Report issued in related Chinese Patent Application No. 201710067177.7 dated Jan. 30, 2021, 3 pages.

* cited by examiner

COMMUNICATION METHOD AND DEVICE

FIELD

Embodiments of the present disclosure generally relate to communication technologies, and more particularly, to a communication method implemented at a communication device and the corresponding communication device.

BACKGROUND

It has been proposed to use a polar code scheme for 5G enhanced mobile broadband (eMBB) control channels, mass machine-type communication (mMTC) and the like. Compared with other coding schemes, the polar coding scheme can bring about many advantages to communication systems, for example, reducing complexity and increasing capacity.

The often used decoding scheme corresponding to the polar coding scheme is list decoding, such as cyclic redundancy check (CRC)-aided list decoding. To achieve high performance, a large list size (for example, 32) is usually needed for decoding. The complexity of polar code is directly proportional to the list size. For example, the complexity of polar code can be modeled by $L*\log 2N$, where N is the size of the unpunctured codeword and L is the list size. Thereby, a large list size will provide better decoding performance, for example, low BLER. Further, the reception effect of a communication device may be improved.

However, a large list size, on the other hand, means high complexity, which consumes more storing space and results in higher power consumption. In particular, for a terminal device carrying out mMTC type communication, since a large amount of blind testing needs to be performed during receiving from control channels, if a large list size is used, the power consumption of the terminal device will increase sharply. As a result, requirements on low power consumption of mMTC type communication cannot be met.

SUMMARY

Generally embodiments of the present disclosure provide a communication method implemented at a communication device and the corresponding communication device, so as to achieve higher decoding performance with lower complexity.

In a first aspect, embodiments of the present disclosure provide a communication method implemented at a first device. The method comprises: determining quantities of information of units in control information; mapping, based on the quantities of information of the units and reliabilities of subchannels for carrying the control information, the units to the subchannels; encoding the mapped subchannels; and transmitting a signal containing a result of the encoding to a second device.

In this aspect, embodiments of the present disclosure further provide a first device for communication, comprising: a controller configured to determine quantities of information of units in control information; map, based on the quantities of information of the units and reliabilities of subchannels for carrying the control information, the units to the subchannels; and encode the mapped subchannels; and a transceiver configured to transmit a signal containing a result of the encoding to a second device.

Embodiments of the present disclosure further comprise a first device for communication. The device comprises: a processor and a memory having instructions stored therein, which, when executed by the processor, cause the device to perform a method according to the first aspect.

Embodiments of the present disclosure further comprise a first device for communication. The device comprises: means for determining quantities of information of units in control information; means for mapping, based on the quantities of information of the units and reliabilities of subchannels for carrying the control information, the units to the subchannels; means for encoding the mapped subchannel; and means for transmitting a signal containing a result of the encoding to a second device.

In a second aspect, embodiments of the present disclosure provide a communication method implemented at a second device. The method comprises: receiving, from a first device, a signal carrying control information; and determining, based on information on mapping between subchannels and units in the control information, the control information from the received signal.

In this aspect, embodiments of the present disclosure further provide a second device for communication. The device comprises: a transceiver configured to receive from a first device a signal carrying control information; and a controller configured to determine, based on information on mapping between subchannels and units in the control information, the control information from the received signal.

Embodiments of the present disclosure further comprise a second device for communication. The device comprises: a processor and a memory having instructions stored therein, which, when executed by the processor, cause the terminal device to perform a method according to the second aspect.

Embodiments of the present disclosure further comprise a second device for communication. The apparatus comprises: means for receiving, from a first device, a signal carrying control information; and means for determining, based on information on mapping between subchannels and units in the control information, the control information from the received signal.

As is to be understood from the following description, according to embodiments of the present disclosure, a unit with a low quantity of information in control information is mapped to a subband with a low reliability, so that the unit with a low quantity of information is decoded as a frozen bit. Therefore, the complexity and power consumption may be reduced while the decoding performance is maintained and even improved.

It should be appreciated contents as described in the SUMMARY portion are not intended to limit key or important features of embodiments of the present disclosure or used to limit scopes of the present disclosure. Other features of the present disclosure will become easier to understand from the following description.

BRIEF DESCRIPTION OF THE DRAWINGS

The above and other features, advantages and aspects of various embodiments of the present disclosure will become apparent from the following detailed illustration, with reference to the accompanying drawings in which the same or similar reference numerals denote the same or similar elements, wherein.

DETAILED DESCRIPTION OF EMBODIMENTS

Figure 1:
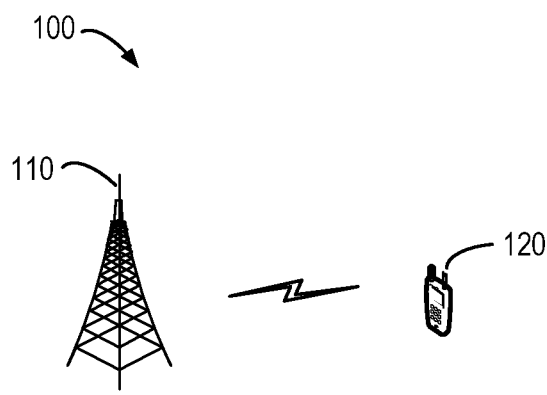
FIG. 1 shows an example communication network in which embodiments of the present disclosure are implemented.

Embodiments of the present disclosure will be described in details with reference to the accompanying drawings. Although some embodiments of the present disclosure have been illustrated in the accompanying drawings, it should be appreciated that the present disclosure can be implemented in various manners, and thus should not be construed to be limited to the embodiments disclosed herein. On the contrary, those embodiments are provided for a thorough and complete understanding of the present disclosure. It should be understood that the accompanying drawings and embodiments of the present disclosure are merely for the purpose of illustration, rather than limiting the protection scope of the present disclosure.

According to embodiments of the present disclosure, the term "a first device" represents a device for transmitting control information (also referred to as "a transmitting device" below), and the term "a second device" represents a device for receiving the control information (also referred to as "a receiving device" below). Both the first device and the second device may be network devices or terminal devices. For instance, if the first device is a network device and the second device is a terminal device, the first device may transmit downlink control information to the second device. If the first device is a terminal device and the second device is a network device, the first device may transmit uplink control information to the second device. When both the first device and the second device are network devices, they may be a macro base station and a low power node like a Picocell base station, respectively. When both the first device and the second device are terminal devices, they may be user equipment carrying out device-to-device (D2D) communication.

The term "network device" used herein refers to other entity or node with specific functionality in a base station or communication network. The term "base station (BS)" may represent a node B (NodeB or NB), an Evolved Node B (eNodeB or eNB), a remote radio unit (RRU), a radio-frequency head (RH), a remote radio head (RRH), a repeater, or a low power node such as a Picocell, a Femto cell and the like. In the context of the present disclosure, the terms "network device" and "base station" may be used interchangeably, and generally, the eNB is taken as an example of the network device, for the sake of discussion.

The term "terminal device" or "user equipment (UE)" used herein refers to any terminal device that can perform wireless communications with the network device or one another. As an example, the terminal device may comprise a mobile terminal (MT), a subscriber station (SS), a portable subscriber station (PSS), a mobile station (MS) or an access terminal (AT), and the above on-board devices. In the context of the present disclosure, the terms "terminal device" and "user equipment" may be used interchangeably for the sake of discussion.

The terms "comprise", "include" and their variants used herein are to be read as open terms that mean "include, but is not limited to". The term "based on" is to be read as "based at least in part on". The term "one embodiment" is to be read as "at least one embodiment." The term "another embodiment" is to be read as "at least one other embodiment." Definitions of other terms will be presented in description below.

As described above, current technologies have proposed to apply the polar code scheme to eMBB control channels, mMTC communication and the like. However, conventional decoding schemes cannot achieve high decoding performance with low complexity. Therefore, there is a need for an effective approach to achieving higher decoding performance with lower complexity.

To overcome at least part of the above problems and other potential problems, embodiments of the present disclosure provide a communication method. For control information, there are some relatively static bits in physical layer signaling or higher layer signaling (for example, RRC signaling) which remain constant or do not change frequently. Such bits are regarded as units with low quantities of information in embodiments of the present disclosure. According to methods in embodiments of the present disclosure, the first device maps a unit with a low quantity of information to a subchannel with a low reliability based on the quantities of information of respective units and reliabilities of subchannels for carrying the control information, encodes the mapped subchannel, and then transmits a signal to the second device. After receiving the signal, the second device determines the control information from the received signal based on information on the mapping between these units and subchannels. By mapping a unit with a low quantity of information in control information to a subband with a low reliability the unit with a low quantity of information may be decoded as frozen bits, and thereby the implementation complexity is reduced while the decoding performance being maintained.

FIG. 1 shows an example communication network 100 in which embodiments of the present disclosure may be implemented. The communication network 100 includes a network device 110 and a terminal device 120, which communicate with each other. It should be understood the number of network device and the number of terminal device as shown in FIG. 1 are merely for the illustration purpose, without suggesting any limitation. The network 100 may include any appropriate number of network devices and/or terminal devices.

Communication in the network 100 may be implemented according to any appropriate communication protocols, including without limitation to, the first generation (1G), the second generation (2G), the third generation (3G), the fourth generation (4G), the fifth generation (5G) and other cellular communication protocol, wireless local area network communication protocols such as Institute of Electrical and Electronics Engineers (IEEE) 802.11, and/or any other protocols that are currently known or to be developed later. Furthermore, the communication utilizes any appropriate wireless communication technology, including without limitation to, code division multiple access (CDMA), frequency division multiple access (FDMA), time division multiple access (TDMA), frequency division duplexing (FDD), time division duplexing (TDD), multiple input multiple output (MIMO), orthogonal frequency division multiplexing (OFDM), and/or any other technology that is currently known or to be developed in future.

As shown, if the network device 110 transmits control information to the terminal device 120, the network device 110 may act as the first device according to embodiments of the present disclosure, and the terminal device 120 may act as the second device according to embodiments of the present disclosure. On the other hand, if the terminal device 120 transmits control information to the network device 110, the network device 110 may act as the second device according to embodiments of the present disclosure, and the terminal device 120 may act as the first device according to embodiments of the present disclosure.

It should be understood that the number of network device and the number of terminal device as shown in FIG. 1 are merely for the illustration purpose without suggesting any limitation. The communication network 100 may include any appropriate types and number of base stations, each network device may provide an appropriate scope and/or number of coverage, and the communication network 100 may further include any appropriate types and/or number of terminal devices.

It should be further understood that communication between the network device 110 and the terminal device 120 as shown in FIG. 1 is merely for the purpose of illustrations not limitation. Those skilled in the art may completely appreciate that the embodiments of the present disclosure are applicable not only to communication between the network device 110 and the terminal device 120 but also to communication between network devices or between terminal devices.

With reference to FIG. 2 to FIG. 12, principles and specific embodiments of the present disclosure will be illustrated in details from the perspective of the first device and the second device. First referring to FIG. 2, it shows a flowchart of a method 200 implemented at the first device according to some embodiments of the present disclosure. It will be understood the method 200 may be implemented at, for example, the network device 110 or the terminal device 120 as shown in FIG. 1.

The method 200 starts at 210, where the first device determines a quantity of information of a unit in control information. In embodiments of the present disclosure, the unit in the control information may include one or more bits in the control information. For instance, one unit may be 1 bit or a set of bits, for example, 2 bits, 4 bits, 8 bits and the like.

As an alternative solution, the unit in the control information may also include one or more information elements (IE) in the control information. The information element may contain length-variable information, with its structure including fields such as Element ID, Length, Information and the like. Among these fields, Element ID represents a type of the information element, Length represents the length of field Information, and Information represents information which the information element conveys.

It should be understood that the foregoing example of the unit in the control information is merely an example and non-limiting. Those skilled in the art may use other appropriate ways to divide the control information into one or more units. In some embodiments, one field may be regarded as one unit. In further embodiments, one set of bits (also referred to as "bit set") consisting of multiple bits may be regarded as one unit.

In embodiments of the present disclosure, a quantity of information of a unit in the control information represents uncertainty of the unit or information contained in the unit with regard to the receiver. If a quantity of information of a unit is high or a unit has a high quantity of information, this means high uncertainty. On the contrary, if a quantity of information of a unit is low or a unit has a low quantity of information, this means low uncertainty, that is, high certainty.

A quantity of information of a unit may be determined in various ways. In some embodiments, a quantity of information of a unit may be determined from the type of the unit. The type of the unit may be reserved or unreserved. Specifically, the first device may first determine the type of each unit in the control information. Then, in response to the unit being a reserved unit, for example, some predefined unused bit or bits, the first device may determine that the unit has a low quantity of information. On the other hand, if the unit is an unreserved unit, for example, a bit, a field, an information element and the like that has been assigned to carry predefined information, then the first device may determine the unit has a high quantityies of information.

Alternatively and/or additionally, in some embodiments, a quantity of information of a unit may be determined from information contained in the unit. Specifically, the first device may first determine information contained in each unit in the control information. If information contained in the unit is static or changes slowly, then the first device may determine the unit has a low quantity of information. On the contrary, if information contained in the unit changes dynamically, then the first device may determine the unit has a high quantity of information.

In some embodiments, for example, if a unit contains at least one of a terminal device identifier (for example, UE ID), a network device identifier (for example, eNB ID), a cell identifier (for example, CELL ID), a channel identifier (for example, logical channel identifier (LCID)) and the like, then information contained in the unit may be determined as static or changing slowly. For another example, if information contained in a unit represents a frequently changing parameter in communication, then it may be considered that information contained in the unit changes dynamically.

It should be understood the foregoing examples of determining a quantity of information of a unit is merely for the purpose of illustration not limitation. Those skilled in the art may use other appropriate ways to determine a quantity of information of a unit within the scope of the present disclosure. For example, statistics may be made on historical quantities of information of different units in the control information within a period of time, and then the quantity of information of each unit may be determined according to a statistical value. As another example, a quantity of information of a unit may also be determined based on information contained in the unit or the type of the unit specified by existing standards, specifications or rules.

Description is presented below with respect to how to determine a quantity of information of a unit by way of more detailed examples. Take a master information block (MIB) message as an example. The message is as below:

```
MasterInformationBlock ::=    SEQUENCE {
    dl-Bandwidth              ENUMERATED {
                                  n6, n15, n25, n50, n75, n100},
    phich-Config              PHICH-Config,(4 bits)
    systemFrameNumber         BIT STRING (SIZE (8)),
    spare                     BIT STRING (SIZE (10))
}
```

In this message, the "dl-Bandwidth" is relatively fixed for a specific terminal device after accessing the same network. The "spare" bits may be assumed to be zero or static. The "systemFrameNumber" changes every frame, so it may be considered static in this frame. It may be considered that these static bits convey less information, that is, quantities of information of these static bits are relatively low. Therefore, these static bits may be placed on subchannels with lower reliabilities. For other bits that change slowly, their quantities of information are relatively high, so they may be placed on subchannels with higher reliabilities. In addition, bits that change frequently have high quantities of information, thus they may be placed on subchannels with high reliabilities.

Take a system information block 2 as another example, where frequency information (for example, carrier frequency, bandwidth and the like) may be considered static, while information such as subframe configuration information (for example, "mbsfn-SubframeConfigList") and resource configuration information ("radioResourceConfigCommon") may be considered dynamic.

Referring back to the method 200, at 220, the unit is mapped to a subchannel based on the quantity of information of the unit and the reliability of the subchannel for carrying the control information. According to embodiments of the present disclosure, the reliability of the subchannel may be determined in various ways. For example, the reliability of the subchannel may be determined based on the employed coding scheme. It should be understood the reliability of the subchannel may also be determined by other approaches commonly used in the art, which is omitted here.

The mapping between the unit in the control information and the subchannel may be implemented in several ways. In one embodiment, the first device may sort multiple units based on quantities of information of these units and sort various subchannels based on reliabilities of these subchannels. Next, the first device may map the sorted units to the sorted subchannels. Through this process, a unit with a low quantity of information may be mapped to a subchannel with a low reliability, and a unit with a high quantity of information may be mapped to a subchannel with a high reliability.

Figure 3:
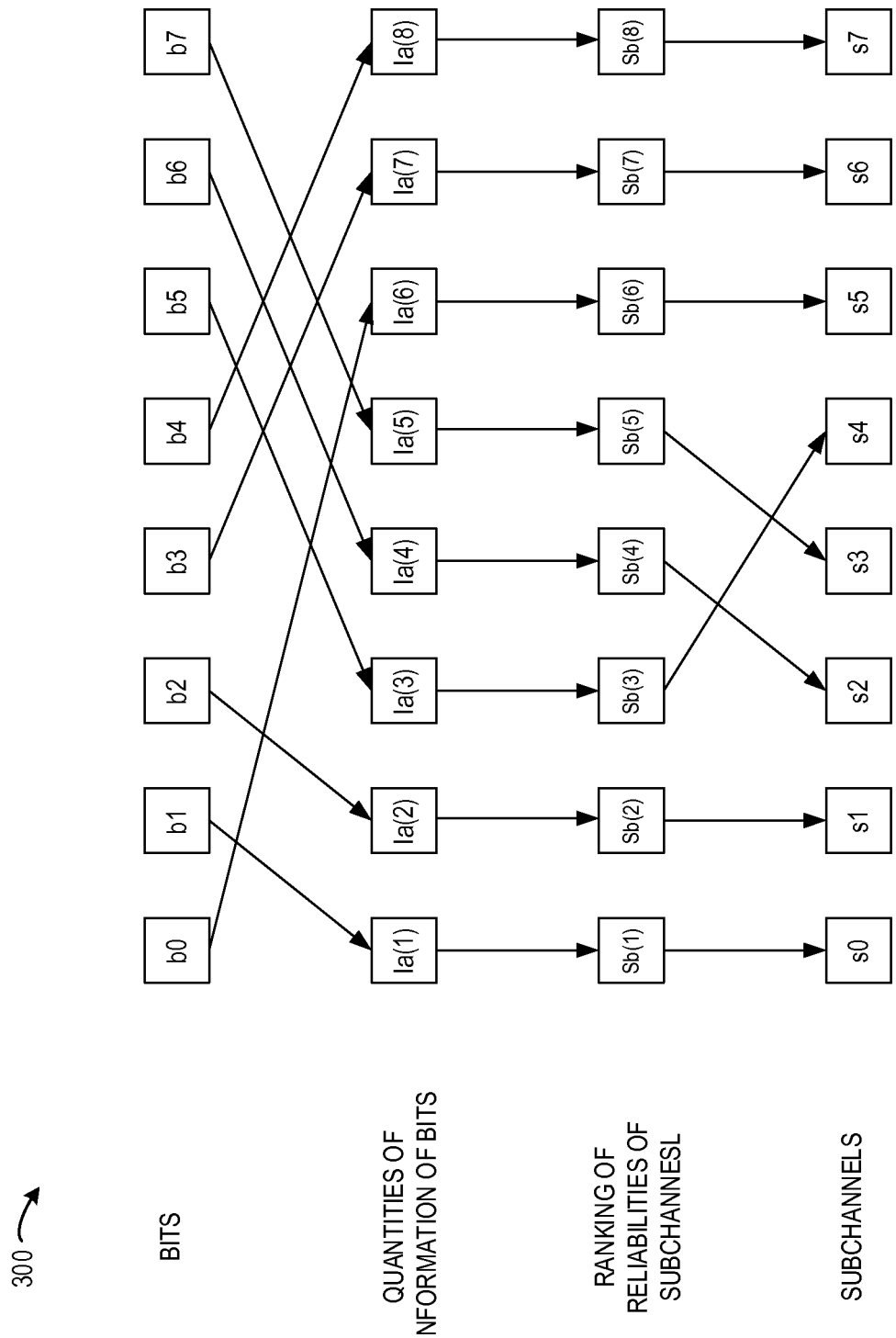
FIG. 3 shows a schematic view of a mapping process between units and subchannels according to some embodiments of the present disclosure.

FIG. 3 shows a schematic view of the process of mapping units to subchannels according to some embodiments of the present disclosure. Assume that control information has K bits, namely $b_0, b_1, \ldots, b_{K-1}$, and the quantity of information of the $i^{th}$ bit is denoted by Ii. By sorting quantities of information of the K bits in increasing order, a sequence is obtained: Ia(1), Ia(2), . . . , Ia(K), where a(i) denotes the index of such a bit whose quantity of information is ranked the $i^{th}$ in the sequence. In addition, assume that K subchannels are $s_0, s_1, \ldots, s_{K-1}$, and by sorting these subchannels in increasing order based on the reliability, a sequence Sb(1), Sb(2), . . . , Sb(K) is obtained.

In the embodiment shown in FIG. 3, assume that K=8, then the quantity of information of bit b0 is ranked $6^{th}$, i.e., Ia(6); the quantity of information of bit b1 is lowest and ranked $1^{st}$, i.e., Ia(1); and so forth, the quantity of information of bit b4 is highest and ranked $8^{th}$, i.e. Ia(8). Ia(1) to Ia(8) are mapped to the sequence Sb(1), Sb(2), . . . , Sb(8) with the reliabilities in increasing order.

Subsequently, the relationship between the sequence Sb(1), Sb(2), . . . , Sb(8) and the sub-channels $s_0, s_1, \ldots, s_7$ may be determined according to the relationship between subchannels and their reliabilities. As shown in FIG. 3, it may be determined the subchannel with the lowest reliability is $s_0$, the subchannel with the second lowest reliability is $s_1$, and then $s_4, s_2, s_3, s_5, s_6, s_7$ in this order. In other words, the subchannels that have been ranked in increasing order by reliabilities are $s_0, s_1, s_4, s_2, s_3, s_5, s_6, s_7$.

Through the foregoing operations, the bits $b_0, b_1, \ldots, b_7$ may be mapped to the subchannels $s_0, s_1, s_4, s_2, s_3, s_5, s_6, s_7$ in this order, respectively. Thereby, a unit with a lower quantity of information may be mapped to a subchannel with a lower reliability, and a unit with a higher quantity of information may be mapped to a subchannel with a higher reliability.

Still with reference to the method 200, at 230, the first device encodes the mapped subchannel. The coding process may use the polar coding scheme or other appropriate coding schemes, which are omitted here. At 240, the first device transmits a signal including an encoding result to the second device.

By mapping the unit with a lower quantity of information in the control information to the subchannel with a lower reliability, the unit with low quantities of information is decoded as a frozen bit in the polar code scheme, which contributes to increase the decoding speed and reduce the decoding complexity. Thereby, the complexity and power consumption may be reduced while the decoding performance is maintained and even improved.

According to embodiments of the present disclosure, information on the mapping between units and subchannels (also referred to as "mapping relationship" below) may be predefined, for example, predefined at the first device and the second device respectively according to standards, protocols or rules. In this case, after receiving a signal on the control information from the first device, the second device may determine from the received signal which unit or units have lower quantities of information, according to the predefined mapping relationship between units and subchannels. Thereby, decoding may be implemented using the unit or units, so as to improve the decoding speed and reduce the decoding complexity.

As an alternative solution, information on the mapping between units and subchannels may not be predefined at the first device and the second device, but the first device dynamically notifies the second device of the information. In some embodiments, the first device may transmit information on the mapping between units and subchannels to the second device. For example, the information on the mapping may be sent via RRC signaling, where the RRC signaling may be implemented using Abstract Syntax Notation One (ASN.1). As an alternative solution, the information on the mapping may also be sent via physical layer signaling/scheduling signaling.

The present disclosure is described in details below using more embodiments with reference to FIGS. 4 to 6. In embodiments shown in FIGS. 4 and 5, bits are used as a unit of control information. In the embodiment shown in FIG. 6, information elements are used as a unit of control information.

Figure 4:
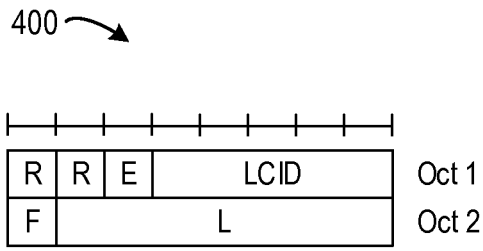
FIG. 4 shows a schematic view of a structure of a media access control (MAC) or radio link control (RLC) header according to some embodiments of the present disclosure.

FIG. 4 shows a schematic view of a MAC/RLC header structure 400 according to some embodiments of the present disclosure. In the embodiment shown in FIG. 4, "R" denotes a reserved field, "E" denotes an extended field, "LCID" denotes a logical channel identifier, "F" denotes a type of field "L", and field "L" denotes length information. Since the terminal device knows LCID when it has only one logical channel, in this case LCID may be considered static and has low quantities of information. In addition, since "R" is the reserved type, bits corresponding to R may also be considered as having low quantities of information. Compared with "R", since LCID might change or change slowly, bits of "R" may be determined as having lower quantities of information than those of LCID. In addition, in this embodiment, all fields "E", "F" and "L" or bits contained therein may be considered as having higher quantities of information. In some embodiments, "E", "F" and "L" may be sorted by quantities of information, which may be determined, for example, according to an empirical value, specification/protocol regulations, a historical sorting result, etc.

Figure 5:
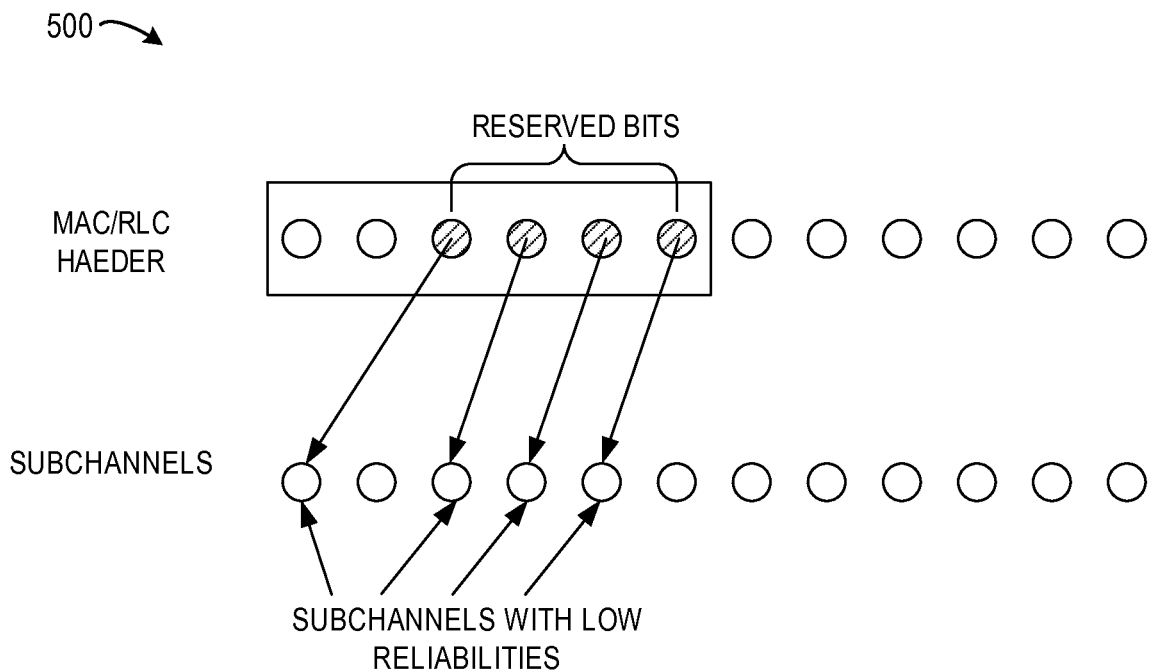
FIG. 5 shows a schematic view of a mapping relationship between bits of a MAC or RLC header and subchannels according to some embodiments of the present disclosure.

FIG. 5 shows a schematic view of a mapping relationship 500 between bits at the MAC/RLC header and subchannels according to some embodiments of the present disclosure. As shown in FIG. 5, reserved bits are mapped to respective low reliability subchannels.

Figure 6:
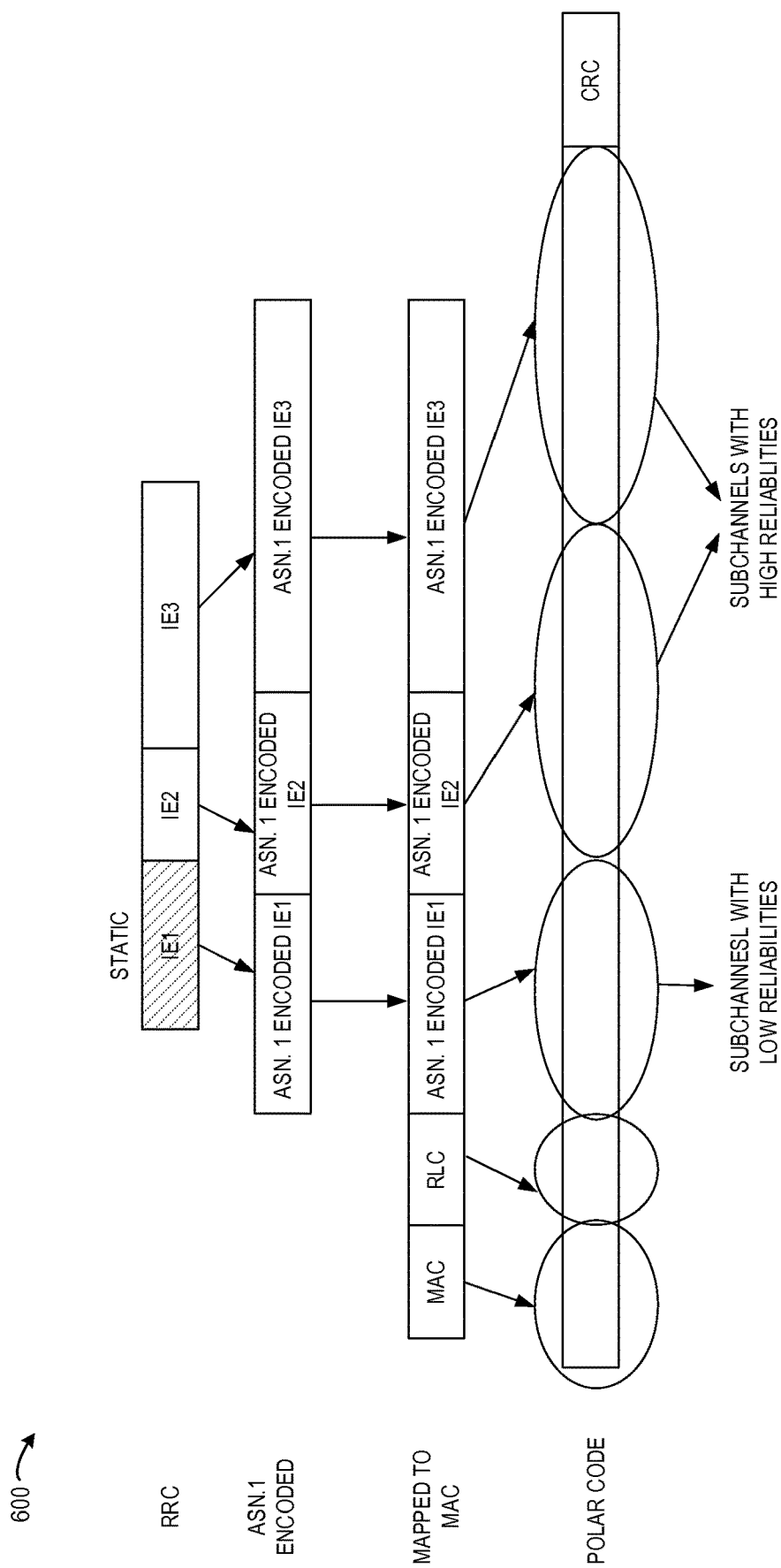
FIG. 6 shows a schematic view of a mapping relationship between information elements (IEs) and subchannels according to some embodiments of the present disclosure.

FIG. 6 shows a schematic view of a mapping relationship 600 between information elements and subchannels according to some embodiments of the present disclosure. In the embodiment shown in FIG. 6, three information elements IE1, IE2 and IE3 will be sent from the first device to the second device. Assume that IE1 is static while IE2 and IE3 change dynamically. After a message is encapsulated through layer 2 and layer 3, IE1 resides on the left part of the message. Generally, for subchannels of the polar coding scheme, the reliability increases from left to right. Therefore, by placing IE1 ahead (i.e. on the left) of IE2 and IE3, IE1 may be mapped to a subchannel with a lower reliability, and IE2 and IE3 may be mapped to subchannels with higher reliabilities.

In some embodiments, the structure of the layer 3 message may be predefined at the first device and the second device. As an alternative solution, the first device may transmit an explicit indication designating the structure of the layer 3 message to the second device. In this way, the second device may know the location of IE1, and know IE1 is sent first and IE1 is static. As another alternative solution, the first device may not transmit the indication to the second device, but the second device judges from statistics whether IE1 is sent first. For example, assume that in previous communications IE1 is sent first with a probability of more than 90%, then the second device may consider that in the signal received this time IE1 is also sent first.

Besides embodiments shown in FIGS. 4 to 6, using a set of bits as a unit also falls within the scope of embodiments of the present disclosure. For example, for a MIB message, multiple bits contained in field "downlink bandwidth" may make one set of bits, and multiple bits contained in field "frame number" may also make another set of bits. Assume that the set of bits corresponding to "downlink bandwidth" is more static than the set of bits corresponding to "frame number", then by mapping the set of bits corresponding to "downlink bandwidth" to subchannels with low reliabilities, the decoding performance will be improved and the complexity will be reduced, and further gains will be produced.

According to other embodiments of the present disclosure, for an uplink channel state indication (CSI), if the terminal device (first device in this embodiment) needs to report CSI information of different beams to the network device (second device in this embodiment), then the terminal device may use indication to indicate the order of data associated with the different beams. Assume that, for these beams, the channel changes less frequently or does not change at all (for example, a channel of a terminal device for mMTC communication changes less frequently), then the information may be treated as static units or units changing slowly and mapped to subchannels with lower reliabilities. In this way, the decoding performance may be improved and the complexity may be reduced, and further gains may be produced.

Figure 7:
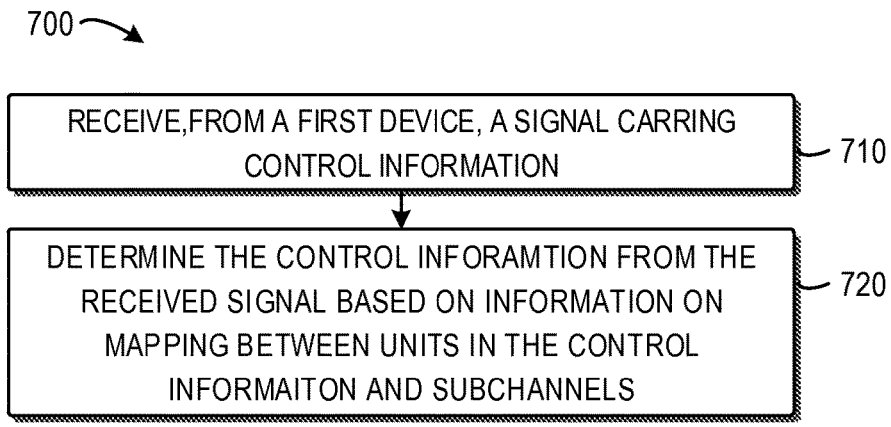
FIG. 7 shows a flowchart of a method implemented at a second device according to some embodiments of the present disclosure.

With reference to FIG. 7 below, it shows a flowchart of a method 700 implemented at the second device according to some embodiments of the present disclosure. It is to be understood the method 700 may be implemented, for example, at the network device 110 or the terminal device 120 as shown in FIG. 1.

The method 700 starts at 710, where the second device receives a signal carrying control information from the first device. According to the embodiments of the present disclosure, the signal may be sent by the first device to the second device as below. Specifically, the first device determines quantities of information of units of the control information, and maps these units to subchannels on the basis of the determined quantities of information and reliability of the subchannels for carrying the control information. Then, the first device encodes the mapped subchannels and transmits a signal containing an encoding result to the second device.

At 720, the second device determines the control information from the received signal based on information on mapping between units in the control information and subchannels. Units in control information may be bits, a set of bit or information elements in the control information. In some embodiments, the second device may determine a unit with a low quantity of information in the control information based on information on mapping between units in the control information and subchannels. Then, the second device may decode the received signal by using the unit having the low quantity of information.

In some embodiments, the information on mapping between units and subchannels may be predefined, for example, preset at the first device and the second device respectively according to standards, protocols or rules. In this case, after receiving from the first device the signal about the control information, the second device may determine from the received signal which unit or units have low quantities of information according to the predefined information on mapping, and then may perform decoding using the unit or units.

As an alternative solution, in some embodiments, information on mapping between units and subchannels may not be predefined at the first device and the second device, but the first device dynamically notifies the second device of the information. In this case, the second device may receive information on mapping between units and subchannels from the first device. The information may be received via RRC signaling or physical layer signaling/scheduling signaling for example.

According to the foregoing embodiments, by mapping units with lower quantities of information in control information to subbands with lower reliabilities, the units with low quantities of information are decoded as frozen bits in polar code, which is beneficial to increase the decoding speed and reduce the decoding complexity. Thereby, the complexity and power consumption may be reduced while the decoding performance is maintained and even improved.

In addition, during decoding operation, such units with low quantities of information may further be taken as priori knowledge to improve the soft information in calculation of the path log-likelihood ratio. For example, assume that a bit with a low quantity of information is often 1, the path log-likelihood ratio may be calculated according to such priori knowledge. In the decoding process, the calculated path log-likelihood ratio may be added to the decoded path log-likelihood ratio to correct errors and improve path calculation accuracy.

Figure 8:
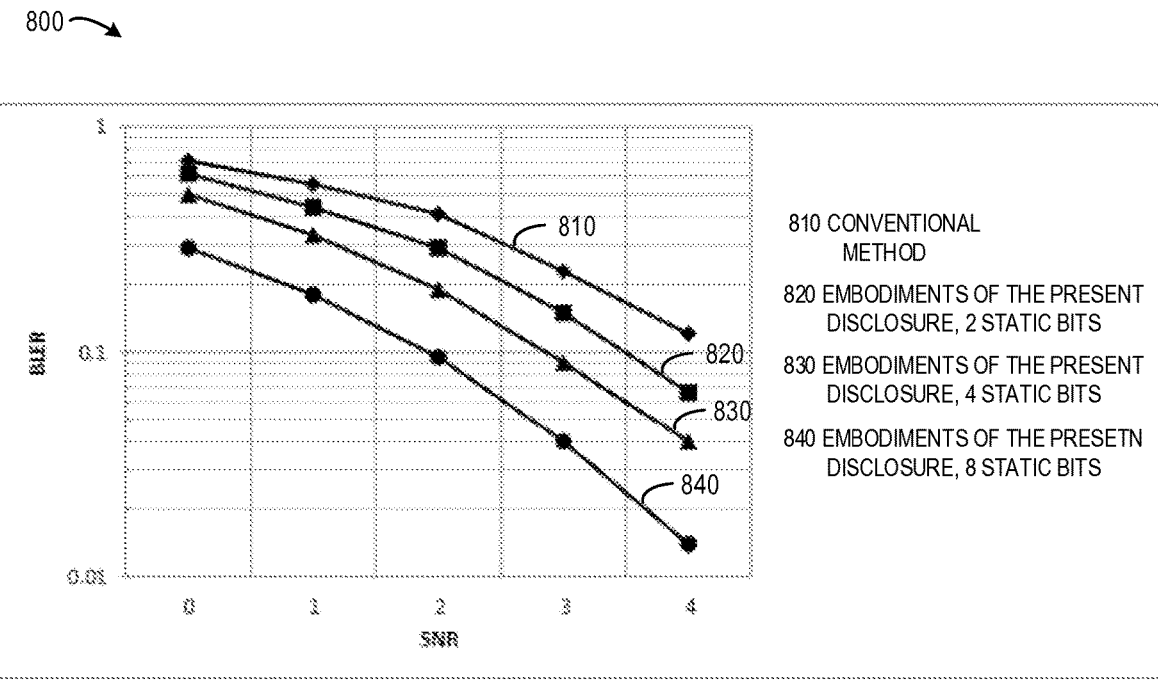
FIG. 8 shows a schematic view of a comparison in decoding performance between the embodiments of the present disclosure and the conventional method.

FIG. 8 shows a schematic view of a comparison in decoding performance between an embodiment of the present disclosure and the conventional method. In this embodiment, assume that control information to be transferred has 16 bits, and assume that the 16 bits are divided according to information contained in these bits, M bits are static and the others change dynamically.

In FIG. 8, a comparison is made between a BLER curve 810 corresponding to the decoding according to the conventional method and BLER curves 820, 830 and 840 corresponding to the decoding when M is 2, 4 and 8 respectively according to embodiments of the present disclosure. As seen from FIG. 8, where the signal-to-noise ratio (SNR) remains the same, the BLER corresponding to the decoding according to embodiments of the present disclosure is significantly less than the BLER according to the conventional method. In particular, in embodiments of the present disclosure, the more static bits (for example, M=8), the less the corresponding BLER.

Figure 9:
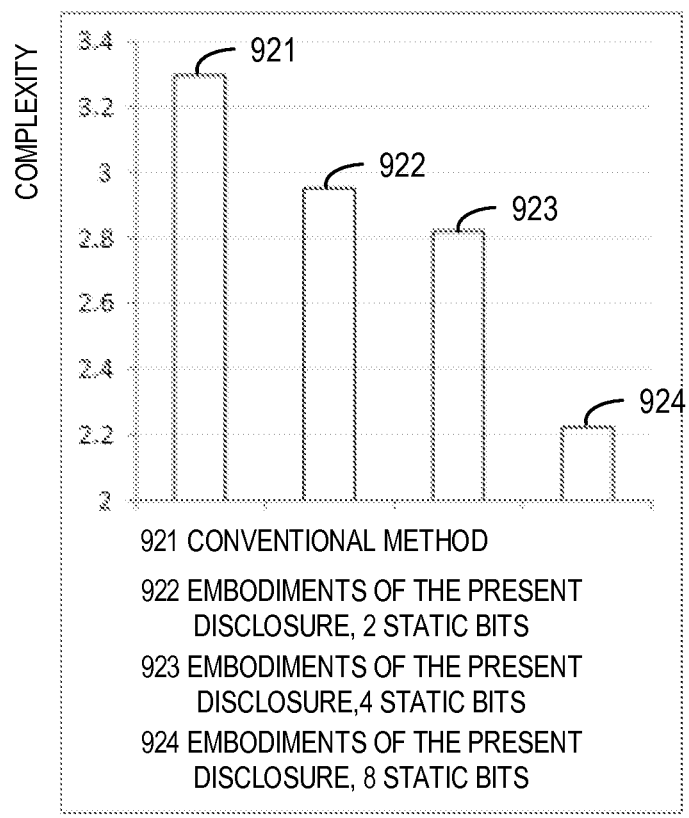
FIG. 9 shows a schematic view of a comparison in complexity between embodiments of the present disclosure and the conventional method

FIG. 9 shows a schematic view of a comparison 900 in complexity between the embodiments of the present disclosure and the conventional method. As shown in FIG. 9, complexity curves 922, 923 and 924 corresponding to the decoding when M is 2, 4 and 8 respectively according to embodiments of the present disclosure are significantly lower than a complexity curve 921 according to the conventional method. In particular, in embodiments of the present disclosure, the more static bits (for example, M=8), the lower the corresponding complexity.

Figure 10:
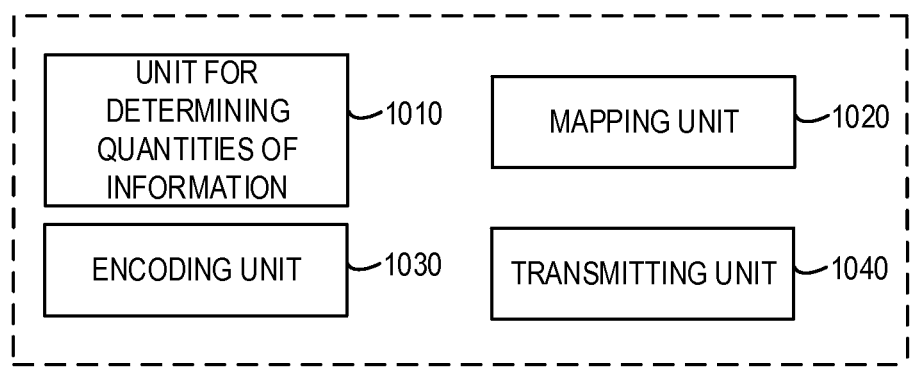
FIG. 10 shows a block diagram of an apparatus at a first device according to some embodiments of the present disclosure.

FIG. 10 shows a block diagram of an apparatus 1000 at a first device according to some embodiments of the present disclosure. It may be understood the apparatus 1000 may be implemented in the network device 110 or the terminal device 120 as shown in FIG. 1. As shown in FIG. 10, the apparatus 1000 includes: a unit 1010 for determining an quantity of information configured to determine a quantities of information of units in control information; a mapping unit 1020 configured to map, based on the quantities of information of the units and reliabilities of a subchannels for carrying the control information, the units to subchannels; an encoding unit 1030 configured to encode the mapped subchannels; and a transmitting unit 1040 configured to transmit a signal containing a result of the encoding to a second device.

In some embodiments, the unit 1010 for determining quantities of information is further configured to: determine a type of each unit in the control information; in response to the unit being a reserved unit, determine the unit has low a quantity of information; and in response to the unit being a unreserved unit, determine the unit has a high quantity of information.

In some embodiments, the unit 1010 for determining quantities of information is further configured to: determine information contained in each unit in the control information; in response to the information contained in the unit being static or changing slowly, determine the unit has a low quantity of information; and in response to the information contained in the unit changing dynamically, determine the unit has s high quantity of information.

In some embodiments, the unit 1010 for determining quantities of information is further configured to: determine the information contained in the unit is static or changes slowly, when the unit includes at least one of: a terminal device identifier, a network device identifier, a cell identifier, and a channel identifier.

In some embodiments, the mapping unit 1020 is further configured to: sort the units based on quantities of information of the units; sort the subchannels based on the reliabilities of the subchannels; and map the sorted units to the sorted subchannels, where a unit with a low quantity of information is mapped to a subchannel with a low reliability and a unit with a high quantity of information is mapped to a subchannel with a high reliability.

In some embodiments, the transmitting unit 1040 is further configured to: transmit information on mapping between the units and the subchannels to the second device.

In some embodiments, the mapping unit 1020 is further configured to: determine based on a coding scheme in use, the reliabilities of the subchannels.

In some embodiments, a unit is a bit, a set of bits or an information element in the control information.

Figure 11:
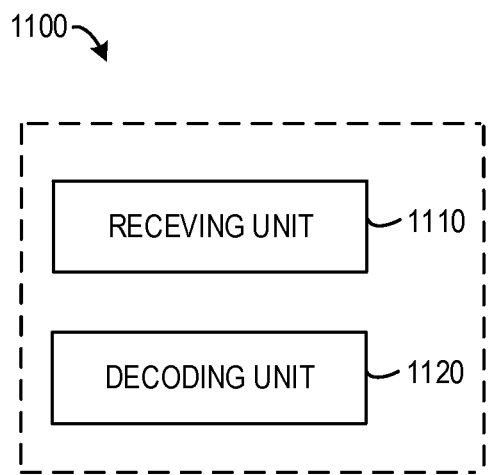
FIG. 11 shows a block diagram of an apparatus at a second device according to some embodiments of the present disclosure.

FIG. 11 shows a block diagram of an apparatus 1100 at a second device according to some embodiments of the present disclosure. It may be understood the apparatus 1100 may be implemented in the network device 110 or the terminal device 120 as shown in FIG. 1. As shown in FIG. 11, the apparatus 1100 includes: a receiving unit 1110 configured to receive, from a first device, a signal carrying control information; and a decoding unit 1120 configured to determine, based on information on mapping between subchannels and units in the control information, the control information from the received signal.

In some embodiments, the decoding unit 1120 is further configured to: determine, based on information on mapping between subchannels and units in the control information, a unit having a low quantity of information in the control information; and decode the received signal using the unit having the low quantity of information.

In some embodiments, the receiving unit 1110 is further configured to receive from the first device the information on mapping between the units and the subchannels.

In some embodiments, the unit is a bit, a set of bits or an information element in the control information.

It is to be understood each unit of the apparatus 1000 and the apparatus 1100 corresponds to each step of the methods 200 and 700 described with reference to FIGS. 2 and 7. Therefore, operations and features described above with reference to FIGS. 2 and 7 are also applicable to the apparatus 1000, the apparatus 1100 as well as units included in them, and meanwhile have the same effect, details of which are ignored here.

The units included in the apparatus 1000 and the apparatus 1100 may be implemented in various manners, including software, hardware, firmware, or any combination thereof. In one embodiment, one or more units may be implemented using software and/or firmware, for example, machine-executable instructions stored on the storage medium. In addition to or instead of machine-executable instructions, parts or all of the units in the apparatus 1000 and the apparatus 1100 may be implemented, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

The units shown in FIGS. 10 and 11 may be implemented, partially or entirely, as hardware modules, software modules, firmware modules or any combination thereof. In particular, in some embodiments, the flows, methods or processes described above may be implemented by hardware in a base station or terminal device. For example, the base station or terminal device may implement the methods 300 to 800 by means of its transmitter, receiver, transceiver and/or processor.

Figure 12:
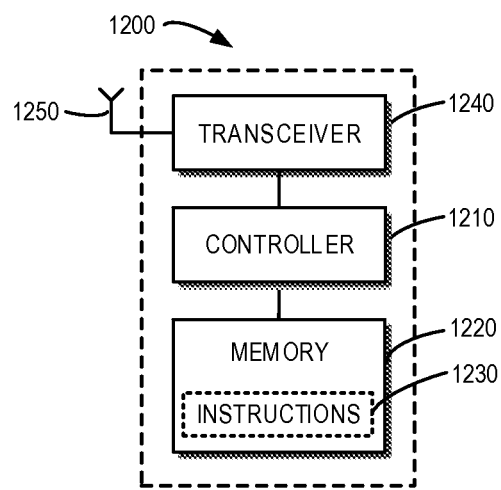
FIG. 12 shows a block diagram of a device according to some embodiments of the present disclosure.

FIG. 12 shows a block diagram of a device 1200 which is applicable to implement the embodiments of the present disclosure. The device 1200 may be used for implementing a network device or a terminal device, for example, the network device 110 and the terminal device 120 as shown in FIG. 1.

As depicted, the device 1200 includes a controller 1210. The controller 1210 controls operations and functions of the device 1200. For example, in some embodiments, the controller 1210 may execute various operations by means of instructions 1230 stored in a memory 1220 coupled to the controller 1210. The memory 1220 may be of any appropriate type that is applicable to a local technical environment, and may be implemented using any appropriate data storage techniques, including without limitation to, semiconductor based memory devices, magnetic memory devices and systems, optical memory devices and systems. Though only one memory unit is shown in FIG. 12, there may be a plurality of physically different memory units in the device 1200.

The controller 1210 may be of any appropriate type that is applicable to a local technical environment, and may include without limitation to, a general-purpose computer, a special-purpose computer, a microprocessor, a digital signal processor (DSP), as well as one or more processors in a processor based multi-core processor architecture. The device 1200 may also comprise multiple controllers 1210. The controller 1210 is coupled to a transceiver 1240 that may affect information receiving and transmitting by means of one or more antennas 1250 and/or other component.

When the device 1200 acts as the network device 110, the controller 1210 and the transceiver 1240 may operate in cooperation to implement the method 200 described with reference to FIG. 2. The controller 1210 is configured to determine quantities of information of units in control information; map, based on the quantities of information of the units and reliabilities of subchannels for carrying the control information, the units to the subchannels; and encode the mapped subchannels. The transceiver 1240 is configured to transmit a signal containing a result of the encoding to a second device.

In some embodiments, the controller 1210 may be further configured to: determine a type of each unit in the control information; in response to the unit being a reserved unit, determine the unit has a low quantity of information; and in response to the unit being an unreserved unit, determine the unit has a high quantity of information.

In some embodiments, the controller 1210 may be further configured to: determine information contained in each unit in the control information; in response to the information contained in the unit being static or changing slowly, determine the unit has a low quantity of information; and in response to the information contained in the unit changing dynamically, determine the unit has a high quantity of information.

In some embodiments, the controller 1210 may be further configured to: determine the information contained in the unit is static or changes slowly, if the unit includes at least one of: a terminal device identifier, a network device identifier, a cell identifier, and a channel identifier.

In some embodiments, the controller 1210 may be further configured to: sort the units based on quantities of information of the units; sort the subchannels based on the reliabilities of the subchannels; and map the sorted units to the sorted subchannels, where a unit with a low quantity of information is mapped to a subchannel with a low reliability and a unit with a high quantity of information is mapped to a subchannel with a high reliability.

In some embodiments, the controller 1210 may be further configured to: transmit information on mapping between the units and the subchannels to the second device.

In some embodiments, the controller 1210 may be further configured to: determine, based on a coding scheme in use, the reliabilities of the subchannels.

In some embodiments, the unit is a bit, a set of bits or an information element in the control information.

When the device 1200 acts as the terminal device 120, the controller 1210 and the transceiver 1240 may operate in cooperation to implement the method 700 described with reference to FIG. 7. The transceiver 1240 is configured to receive, from a first device, a signal carrying control information; and the controller 1210 is configured to determine, based on information on mapping between subchannels and units in the control information, the control information from the received signal.

In some embodiments, the controller 1210 may be further configured to: determine, based on information on mapping between subchannels and units in the control information, a unit having a low quantity of information in the control information; and decode the received signal using the unit having the low quantity of information.

In some embodiments, the controller 1210 may be further configured to: receive, from the first device, the information on mapping between the units and the subchannels.

In some embodiments, the unit is a bit, a set of bits or an information element in the control information.

Figure 2:
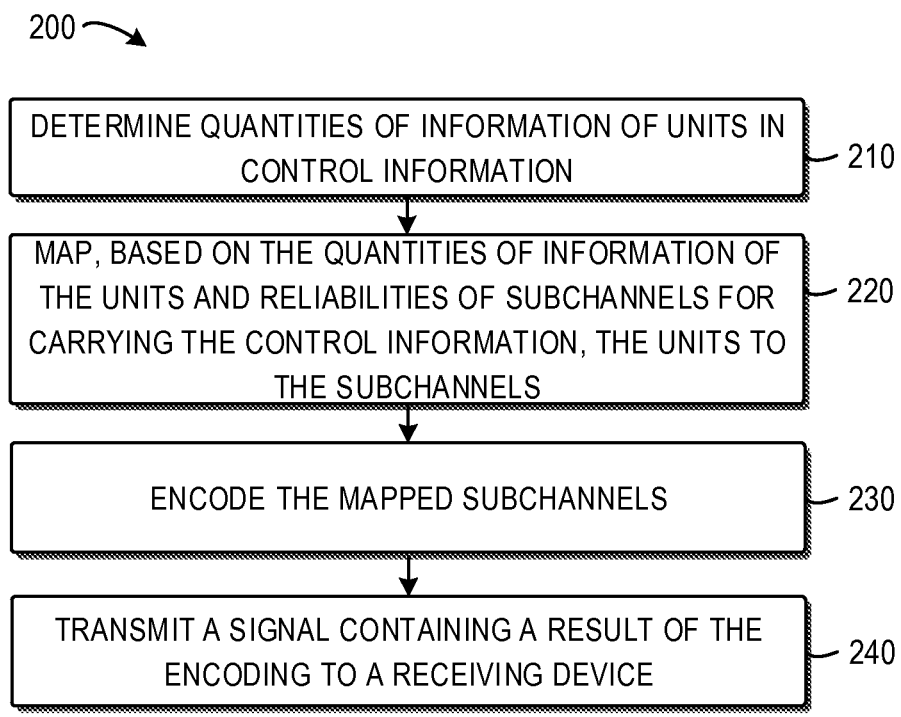
FIG. 2 shows a flowchart of a method implemented at a first device according to some embodiments of the present disclosure.

All features described with reference to FIGS. 2 and 7 are applicable to the device 1200, which is omitted here.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

For example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of this disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may include but is not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the subject matter has been described in a language that is specific to structural features and/or method actions, it is to be understood the subject matter defined in the appended claims is not limited to the specific features or actions described above. On the contrary, the above-described specific features and actions are disclosed as an example of implementing the claims.

I claim:

1. A communication method implemented at a first device, comprising:
   determining quantities of information of units in control information;
   mapping, based on the quantities of information of the units and reliabilities of subchannels for carrying the control information, the units to the subchannels;
   encoding the mapped subchannels; and
   transmitting a signal containing a result of the encoding to a second device.

2. The method of claim 1, wherein the determining quantities of information of units in control information comprises:
   determining a type of each unit in the control information;
   in response to the unit being a reserved unit, determining the unit has a low quantity of information; and
   in response to the unit being an unreserved unit, determining the unit has a high quantity of information.

3. The method of claim 1, wherein the determining quantities of information of units in control information comprises:
   determining information included in each unit in the control information;
   in response to the information included in the unit being static or changing slowly, determining that the unit has a low quantity of information; and
   in response to the information included in the unit changing dynamically, determining that the unit has a high quantity of information.

4. The method of claim 3, wherein the information contained in the unit is determined as static or changing slowly, if the unit includes at least one of:
   a terminal device identifier;
   a network device identifier;
   a cell identifier; and
   a channel identifier.

5. The method of claim 1, wherein the mapping the units to the subchannels comprises:
   sorting the units based on quantities of information of the units;
   sorting the subchannels based on the reliabilities of the subchannels; and
   mapping the sorted units to the sorted subchannels, wherein a unit with a low quantity of information is mapped to a subchannel with a low reliability and a unit with a high quantity of information is mapped to a subchannel with a high reliability.

6. The method of claim 1, further comprising:
   transmitting information on the mapping between the units and the subchannels to the second device.

7. The method of claim 1, further comprising:
   determining the reliabilities of the subchannels based on a coding scheme in use.

8. The method of claim 1, wherein a unit is a bit, a set of bits, or an information element in the control information.

9. A communication method implemented at a second device, comprising:
   receiving, from a first device, a signal carrying control information; and determining the control information from the received signal based on information on mapping between subchannels and units in the control information, wherein the determining the control information from the received signal based on information on mapping between subchannels and units in the control information further comprises:

determining, from the control information, a unit having a low quantity of information based on information on mapping between subchannels and units in the control information; and decoding the received signal using the unit having the low quantity of information.

10. The method of claim 9, further comprising:
receiving, from the first device, the information on the mapping between the units and the subchannels.

11. The method of claim 9, wherein a unit is a bit, a set of bits or an information element in the control information.

12. A first device for communication, comprising:
a controller configured to:
  determine quantities of information of units in control information;
  map, based on the quantities of information of the units and reliabilities of subchannels for carrying the control information, the units to the subchannels; and
  encode the mapped subchannels; and
a transceiver configured to transmit a signal containing a result of the encoding to a second device.

13. The device of claim 12, wherein the controller is further configured to:
determine a type of each unit in the control information;
in response to the unit being a reserved unit, determine the unit has a low quantity of information; and
in response to the unit being an unreserved unit, determine the unit has a high quantity of information.

14. A second device for communication, comprising:
a transceiver configured to receive, from a first device, a signal carrying control information; and
a controller configured to determine the control information from the received signal based on information on mapping between subchannels and units in the control information, wherein the controller is further configured to:
determine, from the control information, a unit having a low quantity of information based on information on mapping between subchannels and units in the control information; and
decode the received signal using the unit having the low quantity of information.

15. The device of claim 14, wherein the controller is further configured to:
receive, from the first device, the information on the mapping between the units and the subchannels.

16. The device of claim 14, wherein a unit is a bit, a set of bits or an information element in the control information.

* * * * *